(12) United States Patent
Patel et al.

(10) Patent No.: US 6,973,719 B1
(45) Date of Patent: Dec. 13, 2005

(54) METHOD OF MAKING A THERMAL MANAGEMENT FOR A CIRCUIT BOARD PANEL

(76) Inventors: Rati M. Patel, 1339 E. Stonebridge Dr., Springfield, MO (US) 65803; Roy English, 250 Winston La., Bloomingdale, IL (US) 61018

( * ) Notice: Subject to any disclaimer, the term of this patent is extended or adjusted under 35 U.S.C. 154(b) by 180 days.

(21) Appl. No.: 10/719,595

(22) Filed: Nov. 22, 2003

Related U.S. Application Data

(60) Provisional application No. 60/471,154, filed on May 16, 2003.

(51) Int. Cl.[7] ............... H05K 3/02; H01L 21/44; H01L 21/48; H01L 21/50
(52) U.S. Cl. .................. 29/846; 29/830; 29/831; 29/847; 438/122
(58) Field of Search .............. 29/846, 847, 831, 29/830; 438/54, 122; 257/706, 718; 174/16.3; 451/57, 66, 67, 37

(56) References Cited

U.S. PATENT DOCUMENTS

| | | | |
|---|---|---|---|
| 4,525,247 A | * | 6/1985 | McMonagle ............ 205/125 |
| 4,999,740 A | * | 3/1991 | Ilardi et al. ............ 361/720 |
| 5,497,033 A | * | 3/1996 | Fillion et al. ............ 257/723 |
| 5,857,767 A | | 1/1999 | Hochstein |

OTHER PUBLICATIONS

Thermal Clad (reg.TM) Overview, On-line Technical Bulletin from Bergquist Co.

* cited by examiner

*Primary Examiner*—A. Dexter Tugbang
*Assistant Examiner*—Tai Van Nguyen
(74) *Attorney, Agent, or Firm*—Richard L. Marsh

(57) ABSTRACT

A method of making a thermal management material for a circuit board panel comprising the steps of cutting a thermally conductive, rigid substrate from a larger sheet of heat conducting material, degreasing the thermally conductive substrate, mechanically abrading at least one surface of the thermally conductive substrate, acid cleaning the at least one abraded surface of the thermally conductive substrate, rinsing the thermally conductive substrate, passivating the at least one abraded surface of the thermally conductive substrate to render the at least one surface chemically inert, rinsing the thermally conductive substrate, drying the thermally conductive substrate and baking the thermally conductive substrate at an elevated temperature.

20 Claims, No Drawings

METHOD OF MAKING A THERMAL MANAGEMENT FOR A CIRCUIT BOARD PANEL

RELATED APPLICATION DATA

This application is a non-provisional application of provisional application Ser. No. 60/471,154 filed on May 16, 2003.

BACKGROUND OF THE INVENTION

1. Field of the Invention

This invention relates to a method of making a thermal management material for a circuit board panel, printed circuits formed thereon and circuit boards cut therefrom.

2. Prior Art Statement

Light emitting diodes, LED's, are beginning to replace conventional lighting in many applications. With the development and increasing use of these high-energy output devices, problems with the assembly of the electrical components to the circuit board are increasing. This is primarily due to the excess heat that is generated during the LED operation and thus the necessity to use circuit boards containing a metal heat sink. The metal heat sink is then used for thermal management of the circuit by pulling the heat away from the component during operation. Presently available material, while more than able to dissipate the heat of the component presents assembly issues during the soldering of the LED. At the temperatures sufficient to produce an acceptable solder joint, the temperature of the component during soldering may approach a point where harm to the component occurs or the integrity of the adhesive junction between the electrically insulating material and the heat sink is damaged. It is believed that a certain amount of acid may be generated at the interface of the electrically insulating material and the heat sink because the surface of the heat sink at the time of lamination is not completely inert.

It is known to provide a method of preparing a circuit board from a laminate of dielectric material sandwiched between layers of copper and aluminum comprising the steps of forming at least one through hole in the laminate, anodizing the exposed areas of the aluminum layer in an anodizing solution while electrically isolating the aluminum from the copper, electroplating a conductive metal over the anodized coating, etching exposed areas of the dielectric material and electro-less plating a conductive metal coating over all exposed surfaces of the laminate. For instance, see the U.S. Pat. No. 4,525,247 issued on Jun. 25, 1985, to Rodger P. McMonagle. Circuit boards prepared from panels produced by the above method have been suitable for low temperature applications, however, it has been found that delamination of the dielectric material from the aluminum is prevalent in applications wherein the temperature at the interface between the dielectric and the aluminum exceeds approximately 100 degrees Centigrade and thus thermal management of the panel is limited. Often, delamination occurs during mounting of circuit components as the solder temperature is often 250 degrees Centigrade or higher.

It is also known to provide a printed circuit board comprising a laminated metal substrate designed for dissipating heat having a curable dielectric material located on the substrate, wells in the dielectric material contacting the substrate created by masking the curable dielectric material at the location of the wells, the wells further having active circuit components mounted therein which contact the substrate, the laminated metal substrate having a coefficient of thermal expansion which matches that of the active circuit components. For instance, see the U.S. Pat. No. 4,999,740 issued on Mar. 12, 1991 to Ilardi, et al. Thus, though thermal management of a circuit is achieved by removing the dielectric material in the area of heat generating circuit components, it has been found that delamination of the dielectric material from the substrate still occurs in high ambient operating temperatures and/or during solder mounting of circuit components.

It is further known to provide a method of manufacturing an electrically driven LED lamp assembly comprising the steps of disposing an electrically insulating coating of less than 1000 microns thickness over an electrically and thermally conductive, entirely metal heat sink, printing circuit traces on the coating and adhesively securing light emitting diodes to the circuit traces with an electrically and thermally conductive adhesive. For instance, see U.S. Pat. No. 5,857,767 issued on Jan. 12, 1999 to Peter A. Hochstein. Hochstein provides thermal management of circuit assemblies by avoiding the soldering of components to the circuit board, however it has been found that delamination of the dielectric material from the substrate may still occur in high ambient operating temperatures, particularly where the L. E. D. lamp assembly is confined to a small volume.

Also known is to provide a circuit board panel comprising a copper or aluminum substrate, a layer of epoxy and a layer of copper wherein the layer of epoxy contains finely comminuted, thermally conductive, electrically insulating material such as a ceramic material. For instance, see the technical bulletin entitled Thermal Clad© Overview available on the website of The Bergquist Company. Though thermal management of a circuit board is enhanced by providing thermally conductive material in the layer of epoxy, delamination of the circuit board may still occur at the interface between the epoxy and the substrate in high temperature applications or when applying components to the circuit board.

Finally, it is known by the inventors hereof to prepare a metal surface for painting by conditioning the metal surface with a metal cleaner.

SUMMARY OF THE INVENTION

According to an article by Nancy Dean entitled Materials for Thermal Management found in Advanced Packaging, March 2003, "Four approaches can be taken to reduce thermal resistance: (1) increase thermal conductivity (k) of the interface materials and heat spreaders, (2) increase wetting or bonding to decrease contact resistance (qcontact) at the surface, (3) increase flatness of the spreader to decrease the thickness (t) of the interface to reduce heat transfer path, and (4) eliminate one of the interfaces in the heat sinked package." One object of this invention is to improve the bonding of the heat sink to the electrically insulating material thus decreasing the contact resistance.

Though thermal management of circuit panels and circuit boards has been addressed by providing a direct contact of a portion of a component with the heat sink and/or providing thermally conductive material between the component and the heat sink, delamination from the substrate has not been properly addressed. Therefore, it is an object of this invention to provide a method of fabricating a thermal management material for a circuit board panel comprising the steps of providing a thermally conductive substrate, applying an electrically insulating layer to one surface of the thermally conductive substrate, applying an electrically conductive material to the electrically insulating layer and laminating the thermally conductive substrate, the electrically insulating layer and the electrically conductive material together with heat and pressure wherein the thermal management material is prepared by making at least one surface of the thermally conductive substrate chemically inert, hereinafter, passivating, thus assuring adhesion of the electrically insulating layer to the thermally conductive substrate during the lamination process.

Another object of this invention is to provide a method of making a circuit board panel comprising the steps of: providing a thermally conductive, rigid substrate, chemically decreasing the thermally conductive, rigid substrate, mechanically cleaning at least one surface of the thermally conductive, rigid substrate, acid cleaning the thermally conductive, rigid substrate, rinsing the thermally conductive, rigid substrate and conditioning the thermally conductive, rigid substrate with a metal cleaner to render at least the mechanically cleaned surface chemically inert. Thereafter, an electrically insulating layer is applied to the chemically inert surface of the thermally conductive, rigid substrate, an electrically conductive material is applied to the electrically insulating layer and the thermally conductive, rigid substrate, electrically insulating layer and electrically conductive material are laminated together with heat and pressure.

A primary goal of this invention is to provide a material designed for the thermal management of high temperature components during assembly and operation while improving the assembly process. The thermal management material of this invention will dissipate the required amount of heat from the operating LED and associated components insuring safe operation. The thermal management material of this invention will also facilitate soldering operations thus requiring less heat resulting in less component damage while still providing excellent properties against material delamination from the base metal substrate.

DESCRIPTION OF THE PREFERRED EMBODIMENTS

While the various features of this invention are hereinafter described and illustrated as a method of making a thermally conductive, rigid substrate for a circuit board panel comprising at least the step of passivating at least one surface of the thermally conductive, rigid substrate, it is to be understood that the various features of this invention can be used singly or in various combinations thereof for thermal management material for circuit boards, circuit board panels and the like as can hereinafter be appreciated from a reading of the following description.

In the method of this invention, the thermally conductive, rigid substrate is received in large sheets and thereafter cut to a proper panel size. Aluminum, approximately 0.025 to 0.250 -inch thick, is preferred for its relative low cost and ease of handling, however, other thickness and other heat dissipating materials may be used to advantage such as brass, bronze, copper, steel, alloys or laminates thereof. Though the panel size may be as small as a single required circuit board, it is preferable to provide panels of sufficient size to provide multiple circuit boards upon a single panel whereafter upon completing the circuit board printing process, the individual circuit boards are cut from the panel. The panel size is selected for best utilization of the surface area thereof for the multiplicity of specific circuits to be photo etched upon the electrically conducting surface. Generally, circuit board panels are from 12 inches by 12 inches to approximately 18 inches by 24 inches in size though greater sizes may be utilized depending upon available pressing equipment. As is conventional in preparing circuit board substrates, the thermally conductive substrate is first chemically decreased using available solvents such as methyl ethyl ketone, alcohols, perchloroethylene, trichloroethylene, methylene chloride, 1,1,1 trichloroethane and the like. Preferably, the thermally conductive substrate is immersed in a bath of the cleaning solvent for a period between 30 seconds and two minutes, however, the time required of immersion in the bath of cleaning solvent should be sufficient to insure that processing oils used during the preparation of the substrate at the mill and the identifying indicia printed thereon are completely removed. Alternately, a remote reservoir cleaning method may be used where the selected solvent is sprayed upon the thermally conductive substrate and drains from the surface thereof to be recovered in an enclosed container. Vapor degreasing may also be employed as the cut substrate sheets are generally cold and a vaporized solvent would be effective in removal of soil by condensing on the surface and draining away to a reservoir. Newer methods of degreasing such as dry ice blasting have been proven effective in degreasing the preferred aluminum substrate. Though the above solvents are generally hydrocarbon based solvents, aqueous cleaning solutions using water as the primary solvent may also be employed. A combination of water conditioners, detergents, surfactants, pH buffers, inhibitors, saponifiers, emulsifiers and deflocculants may be added to promote better cleaning of the thermally conductive substrate.

At least one surface of the thermally conductive substrate is mechanically scrubbed to prepare the surface for accepting the dielectric material during the lamination process. Mechanically scrubbing may be accomplished by brushing the surface with a rotating bristle brush engaged with the surface wherein the rotating wire brush is advanced across the surface from side to side and end-to-end to completely abrade the entire surface. The rotating bristle brush has bristles selected from the group comprising steel, brass, abrasive particle coated thermoplastic and combinations thereof. Mechanically scrubbing may also be accomplished by other means such as sanding, vapor honing, scrubbing using a pumice stone, bead blasting, sand blasting or the like. For instance, mechanical scrubbing may be accomplished by forcibly imparting particulate matter against the surface from the group of such process comprising vapor honing, sand blasting, bead blasting or combinations thereof. A primary purpose of mechanically scrubbing the surface or surfaces of the thermally conductive substrate is to increase the available surface area for adhesion of the dielectric material during the lamination process. After mechanically preparing the surface of the thermally conductive substrate, the thermally conductive substrate is immersed in an acid bath to clean away any additional residue not removed in the degreasing and scrubbing processes. In addition, the acid bath etches the thermally conductive substrate as is conventional in the preparation of circuit board panels in order to improve adhesion to the dielectric material. The timing in the acid bath is generally in the range of 30 seconds to two minutes, however, longer times of immersion may be used to advantage. Acids used in the acid bath may be selected from the group comprising hydrochloric, hydrofluoric, phosphoric, sulphuric and citric acids, however, it has been found that a 5–20% sulphuric acid bath provides the best cleaning and etching of the substrate. After the acid bath, the thermally conductive substrate is rinsed in a first tap water rinse at room temperature for approximately one minute, removed from the first water rinse and rinsed again in a clean tap water rinse at room temperature for an additional one minute. Preferably, both water rinses are agitated immersion baths, the agitation assisting the rinsing of the thermally conductive substrate. An additional water bath using de-ionized water may be used though it is usually unnecessary when using the sulphuric acid bath noted above.

Surfaces of the thermally conductive substrate to be laminated with the dielectric material are then chemically conditioned in order to passivate the surface. In the process of passivating, the surface of the thermally conductive substrate is rendered chemically inert. The metal cleaner used for surface passivating may be applied as a spray or dissolved in a suitable solvent wherein the thermally conductive substrate is dipped in a bath of the metal cleaner. Preferably, a dipping bath maintained at a temperature of 150 to 185 degrees Fahrenheit is used with the thermally conductive substrate remaining in the bath for at least five minutes and preferably up to 15 minutes. Longer dipping times may be also be used, however, it has been found that additional surface conditioning beyond at 15 minutes does not significantly improve surface passivating. The chemically inert surface of the thermally conductive substrate prepared by the methods of this invention greatly enhances the adhesion of the dielectric material to the thermally conductive substrate thereby greatly increasing the service temperature of circuit boards manufactured according to the method. Metal cleaners for aluminum substrates may be selected from the group comprising water based acidic aluminum alloy etchant soak mixed 5%–15% by volume w/water, a water based alkaline, non-foaming high pressure aluminum alloy spray cleaner prepared 2%–5% by volume w/water, an aqueous solution of ammonia and an alkali or a mixture of hydrochloric, hydrofluoric, phosphoric and nonylphenol ethoxylate soluted with water these metal cleaners also generally usable for copper, steel, bronze and brass substrates.

After surface passivating in the chemical conditioning bath, the thermally conductive substrate is rinsed in a first tap water rinse at room temperature for approximately one minute, removed from the first rinse and rinsed again in a second tap water rinse at room temperature for approximately one minute. The thermally conductive substrate is removed from the second rinse and rinsed again in a tap water rinse at a temperature of 80 to 120 degrees Fahrenheit for a time of 30 seconds to one minute. Upon completion of the rinsing, the thermally conductive substrate is allowed to air dry until visibly dried and thereafter the thermally conductive substrate is baked at a temperature of 250 to 300 degrees Fahrenheit for 15 to 30 minutes. Air drying may occur naturally by allowing the thermally conductive substrate to remain in an ambient air environment for the appropriate time however, air drying may be enhanced by subjecting the thermally conductive substrate to a moving air stream. Drying may also be a continuous process wherein racks holding multiple thermally conductive substrates prepared to the drying point are moved through a conveyorized chamber forced air and/or infrared drying means installed therein. Baking in a closed oven is preferred wherein the racks used throughout the chemical preparation process to support the thermally conductive substrates may be removed from the final rinse, used in the drying process and thereafter inserted directly into the closed oven without additional handling of the thermally conductive substrate thereby insuring the integrity of the chemical preparation process. Baking may also be automated on a conveyor immediately following the drying process wherein heated forced air and/or infrared heating means are used in the baking process. Upon completion of the baking process, the thermally conductive substrate has thus been properly prepared for the lamination process necessary to complete the circuit board panel.

A thermally conductive substrate prepared according to the above process is then laid up into a circuit board panel by first selecting the proper thickness of epoxy/fiberglass dielectric material and the proper thickness and size of copper foil used for the circuit traces. Preferably, both the epoxy/fiberglass dielectric material and copper foil are selected to be substantially the same size as the thermally conductive substrate. The epoxy/fiberglass dielectric material is a woven fiberglass filled with a curable epoxy material and is generally in the range from 0.0025 inches in thickness to 0.0075 inches in thickness, the thickness of the dielectric selected for the particular circuit board application to be etched upon the panel. The copper foil may range in weight from ½ ounce per square foot to 10 ounces per square foot as required for the particular circuit traces to be etched upon the panel. In the lay up process, the dielectric material is placed upon the passivated surface of the thermally conductive substrate with the copper foil arranged on top of the epoxy/fiberglass dielectric material. The lay up so prepared is inserted between the platens of a heated press preferably with a press sheet arranged over the copper foil. The heated press is closed and the lay up pressed under a pressure of 350 psi for 45 to 90 minutes at a temperature of 340 to 375 degrees Fahrenheit. The laminated material thus produced in the press is removed from the press after opening of the platens and is allowed to return to ambient air temperature. Upon returning to ambient temperature, the material preparation process for a circuit board panel has been completed and conventional processes of preparing circuit traces may be effected.

Though the method of preparing the thermal management material recited above is described for the preparation of circuit board panels having circuit traces on only one side thereof, it is to be fully understood that circuit board panels having circuit traces on both surfaces of the thermal management material may also be prepared according to the process of this invention.

The thermal management material prepared by the above method has passed standardized tests for circuit boards for flame resistance and solder temperature.

While the present invention has been described with reference to the above described preferred embodiments and alternate embodiments, it should be noted that various other embodiments and modifications may be made without departing from the spirit of the invention. Therefore, the embodiments described herein and the drawings appended hereto are merely illustrative of the features of the invention and should not be construed to be the only variants thereof nor limited thereto.

What is claimed is:

1. A method of fabricating a circuit board comprising the steps of: providing a thermal management material, applying an electrically insulating layer to at least one surface of said thermal management material, applying an electrically conductive material to said one electrically insulating layer and laminating said thermal management material, said electrically insulating layer and said electrically conductive material together with heat and pressure wherein the method of making said thermal management material further comprises the steps of cutting a thermally conductive substrate from a larger sheet of heat conducting material, degreasing said thermally conductive substrate, mechanically abrading at least one surface of said thermally conductive substrate, acid cleaning said at least one abraded surface of said thermally conductive substrate, rinsing said thermally conductive substrate, passivating said at least one abraded surface of said thermally conductive substrate to render said at least one surface chemically inert, rinsing said thermally conductive substrate, drying said thermally conductive substrate and baking said thermally conductive substrate at an elevated temperature.

2. A method as in claim 1 wherein said step of degreasing said thermally conductive, rigid substrate is accomplished by dipping said thermally conductive substrate in a solvent selected from the group consisting of methyl ethyl ketone, isopropyl alcohol, methyl alcohol, perchloroethylene, trichloroethylene, methylene chloride, 1,1,1 trichloroethane and combinations thereof.

3. A method as in claim 1 wherein said step of mechanically abrading said surface is accomplished by brushing said surface with a rotating bristle brush.

4. A method as in claim 3 wherein said rotating bristle brush has bristles selected from the group comprising steel, brass, abrasive particle coated thermoplastic and combinations thereof.

5. A method as in claim 1 wherein said step of mechanically abrading said surface is accomplished by forcibly imparting particulate matter against said surface from the group consisting of vapor honing, sand blasting, bead blasting or combinations thereof.

6. A method as in claim 1 wherein said step of mechanically abrading said surface is accomplished moving an abrasive grit selected from the group comprising sanding belts and pumice stone across said surface from side to side and from end to end of said substrate.

7. A method as in claim 1 wherein said step of acid cleaning is accomplished by dipping said substrate in an acid bath solution.

8. A method as in claim 7 wherein said acid bath solution is selected from the group consisting of hydrochloric, hydrofluoric, phosphoric, sulphuric and citric acids.

9. A method as in claim 1 wherein said step of passivating said surface is accomplished by applying at least one metal cleaning solution selected from the group consisting of water based acidic aluminum alloy etchant soak mixed 5%–15% by volume w/water, a water based alkaline, non-foaming high pressure aluminum alloy spray cleaner prepared 2%–5% by volume w/water or a mixture of hydrochloric, hydrofluoric, phosphoric and nonylphenol ethoxylate soluted with water.

10. A method of making a circuit board panel comprising the steps of: providing a thermally conductive, rigid substrate, said thermally conductive substrate prepared by cutting said thermally conductive substrate from a larger sheet of heat conducting material, degreasing said thermally conductive substrate, mechanically abrading at least one surface of said thermally conductive substrate, acid cleaning said at least one abraded surface of said thermally conductive substrate, rinsing said thermally conductive substrate, passivating said at least one abraded surface of said thermally conductive substrate to render said at least one surface chemically inert, rinsing said thermally conductive substrate, drying said thermally conductive substrate and baking said thermally conductive substrate at an elevated temperature thus creating a thermal management material, applying an electrically insulating layer to one surface of said thermal management material, applying an electrically conductive material to said one electrically insulating layer and laminating said thermal management material, said electrically insulating layer and said electrically conductive material together with heat and pressure.

11. A method as in claim 10 wherein said step of degreasing said thermally conductive, rigid substrate is accomplished by dipping said thermally conductive substrate in a solvent selected from the group consisting of methyl ethyl ketone, isopropyl alcohol, methyl alcohol, perchloroethylene, trichloroethylene, methylene chloride, 1,1,1 trichloroethane and combinations thereof.

12. A method as in claim 10 wherein said step of mechanically abrading said surface is accomplished by brushing said surface with a rotating bristle brush.

13. A method as in claim 12 wherein said rotating bristle brush has bristles selected from the group comprising steel, brass, abrasive particle coated thermoplastic and combinations thereof.

14. A method as in claim 10 wherein said step of mechanically abrading said surface is accomplished by forcibly imparting particulate matter against said surface from the group comprising vapor honing, sand blasting, bead blasting or combinations thereof.

15. A method as in claim 10 wherein said step of mechanically abrading said surface is accomplished moving an abrasive grit selected from the group comprising sanding belts and pumice stone across said surface from side to side and from end to end of said substrate.

16. A method as in claim 10 wherein said step of acid cleaning is accomplished by dipping said substrate in an acid bath solution.

17. A method as in claim 16 wherein said acid bath solution is selected from the group consisting of hydrochloric, hydrofluoric, phosphoric, sulphuric and citric acids.

18. A method as in claim 10 wherein said step of passivating said surface is accomplished by applying at least one metal cleaning solution selected from the group consisting of water based acidic aluminum alloy etchant soak mixed 5%–15% by volume w/water, a water based alkaline, non-foaming high pressure aluminum alloy spray cleaner prepared 2%–5% by volume w/water or a mixture of hydrochloric, hydrofluoric, phosphoric and nonylphenol ethoxylate soluted with water.

19. A method as in claim 10 wherein said step of degreasing said thermally conductive, rigid substrate is accomplished by dry ice blasting.

20. In a method of making a circuit board panel comprising a heat conducting substrate, an electrically insulating layer and an electrically conductive material, said electrically insulating layer applied to at least one surface of said heat conducting substrate and said electrically conductive material applied to said one electrically insulating layer, said heat conducting substrate, said electrically insulating layer and said electrically conductive material laminated into said circuit board panel under heat and pressure, said heat conducting substrate originally cut from a larger sheet of heat conducting material, degreased, rinsed and dried, the improvement wherein said heat conducting substrate is mechanically abraded on at least one surface thereof after degreasing said substrate, acid cleaned, rinsed, passivated to render said at least one surface chemically inert, rinsed, and baked at an elevated temperature.

* * * * *